(12) United States Patent
Chiang et al.

(10) Patent No.: US 7,385,867 B2
(45) Date of Patent: Jun. 10, 2008

(54) MEMORY DEVICE AND OPERATING METHOD THEREOF

(75) Inventors: Lu-Ping Chiang, Hsinchu (TW); Po-An Chen, Hsinchu (TW)

(73) Assignee: Winbond Electronics Corp., Hsinchu (JP)

( * ) Notice: Subject to any disclaimer, the term of this patent is extended or adjusted under 35 U.S.C. 154(b) by 27 days.

(21) Appl. No.: 11/613,796

(22) Filed: Dec. 20, 2006

(65) Prior Publication Data

US 2008/0025086 A1    Jan. 31, 2008

(30) Foreign Application Priority Data

Jul. 31, 2006    (TW) .............................. 95127930 A

(51) Int. Cl.
*G11C 7/02*    (2006.01)
(52) U.S. Cl. ..................... 365/207; 365/208; 365/205; 365/189.07; 365/185.05
(58) Field of Classification Search ............... 365/207, 365/208, 205, 189.07, 185.05
See application file for complete search history.

(56) References Cited

U.S. PATENT DOCUMENTS

| 6,320,786 | B1 | 11/2001 | Chang et al. |
| 6,753,801 | B2 * | 6/2004 | Rossi .......................... 341/161 |
| 6,803,794 | B2 * | 10/2004 | Martin et al. ................. 327/52 |
| 6,917,551 | B2 * | 7/2005 | Jeong ......................... 365/205 |

OTHER PUBLICATIONS

Boaz Eitan et al., "NROM: A Novel localized Trapping, 2-Bit Nonvolatile Memory Cell" IEEE electron Device Letters, vol. 21, No. 11, Nov. 2000, pp. 543-545.

* cited by examiner

*Primary Examiner*—Connie C Yoha
(74) *Attorney, Agent, or Firm*—J.C. Patents

(57) ABSTRACT

A method of operating a memory device adapted for determining a program/erase state of a memory cell in the memory device. The method includes applying a drain operation voltage to a drain of the memory cell so that the memory cell generates a working voltage. The working voltage is a function of the drain operation voltage. Then, the working voltage to the drain operation voltage is differentiated to obtain a slope of the working voltage to the drain operation voltage. The program/erase state of the memory cell is determined according to the slope.

10 Claims, 4 Drawing Sheets

MEMORY DEVICE AND OPERATING METHOD THEREOF

CROSS-REFERENCE TO RELATED APPLICATION

This application claims the priority benefit of Taiwan application serial no. 95127930, filed Jul. 31, 2006. All disclosure of the Taiwan application is incorporated herein by reference.

BACKGROUND OF THE INVENTION

1. Field of the Invention

The present invention relates to a memory device and operating method thereof, and more particularly, to a memory device and operating method thereof having a program/erase state defined differently from that of the conventional.

2. Description of Related Art

Nitride storage non-volatile memory (NVM) is a type of memory that allows many times of data writing, reading and erasing operations. Furthermore, the stored data will be retained even after power to the device is removed. With these advantages, nitride storage NVM has been broadly applied in personal computer and other electronic devices.

A typical nitride storage NVM uses a charge-trapping layer instead of the polysilicon floating gate in a conventional NVM. The charge-trapping layer is fabricated by silicon nitride, for example. The silicon nitride charge-trapping layer is sandwiched between an upper silicon oxide layer and a lower silicon oxide layer, thereby forming an oxide/nitride/oxide (ONO) composite layer. The most common NVM devices are silicon/oxide/nitride/oxide/silicon (SONOS) devices and metal/oxide/nitride/oxide/silicon (MONOS) devices.

The conventional method of determining program or erase state of a memory cell having the ONO structure includes applying an operating voltage on the drain, the gate and the source of the memory cell so that a threshold voltage (or a working voltage) is produced in the charge-trapping layer of the memory cell. Through hot electron or hot hole injection, the memory cell can be erased or programmed.

FIG. 1 is a graph with curves showing the relation between the working voltage Vth and the drain operation voltage VD of a memory cell. As shown in FIG. 1, the curves 101 and 103 represent the relationship between the operating voltage Vth and the drain operation voltage VD for the erase and the program state of a brand-new memory cell. According to FIG. 1, it can be clearly seen that, as the voltage VD at the drain of the memory cell is about 0.24V, the operating voltage difference OM1 between the curves 101 and 103 is about 3V (3.6V−1.6V). Conventionally, this operating voltage difference is used to define the program/erase state of the memory cell. Obviously, when the voltage VD at the drain is about 1.8V, the operating voltage difference OM2 between the curves 101 and 103 is reduced to about 0.46V (1.66V−1.2V) due to the drain inductance barrier lowering (DIBL) effect. Therefore, operating at a higher drain voltage will lead to a retraction of the operating boundary.

In addition, it can be observed from FIG. 1 that when the memory device has completed one cycle of the program/erase operations (set to 1000 operations in FIG. 1), the curve 101 will migrate from its original location up to the curve 105 and the curve 103 will migrate from its original location up to the curve 107. From the standpoint of the drain operation voltage Vd set to 0.24V, the operating boundary (OM3) of the program and erase state has retracted from the original 3V to 2V (4.8V−2.8V). Thus, after the memory device has performed a cycle of operations, a retraction of the operating boundary will occur. Therefore, the memory device is more vulnerable to produce erroneous actions.

SUMMARY OF THE INVENTION

Accordingly, the present invention is to provide a memory device capable of preventing erroneous actions in a memory cell as a result of an increase in the drain operation voltage of the memory cell or completion of an erase/program cycle.

In addition, the present invention is to provide a method of operating a memory device capable of maintaining a fixed operating boundary for a memory cell either under an increase in the drain operation voltage or after an erase/program cycle.

To achieve these and other advantages and in accordance with the purpose of the invention, the memory device includes at least a memory cell disposed between a word line and a bit line. The present invention also includes a comparator with a first compare input terminal and a second compare input terminal. The first compare input terminal is grounded through a first passive device. Similarly, the second compare input terminal is grounded through a second passive device. In addition, the present invention includes a first switching circuit and a second switching circuit. The first switching circuit is selected to apply either a first operating voltage or a second operating voltage to the drain of the memory cell so that the memory cell generates a working current. The second switching circuit directs the working current produced by the memory cell to the first compare input terminal or the second compare input terminal through the bit line.

In the embodiment of the present invention, the first passive device and the second passive device may be capacitors or resistors.

The present invention also provides a method of operating a memory device including applying a first drain operation voltage to the drain of a memory cell so that the memory cell generates a first working current. A second drain operation voltage is applied to the drain of the memory cell so that the memory cell generates a second working current. Then, the first working current is transformed into a first working voltage and the second working current is transformed into a second working voltage. The difference between the second working voltage and the first working voltage is divided by the difference between the second operating voltage and the first operating voltage to obtain a partial differential value. The present invention utilizes this partial differential value to determine the program/erase state of the memory cell.

Accordingly, because the slope of the working voltage to the drain operation voltage is utilized to determine if the memory cell is in program state or erase state, the present invention prevents erroneous actions as a result of operating at a high working voltage or passing through a program/erase cycle. In other words, the memory device in the present invention is able to operate after multiple program/erase cycles or within a larger drain operation voltage range.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
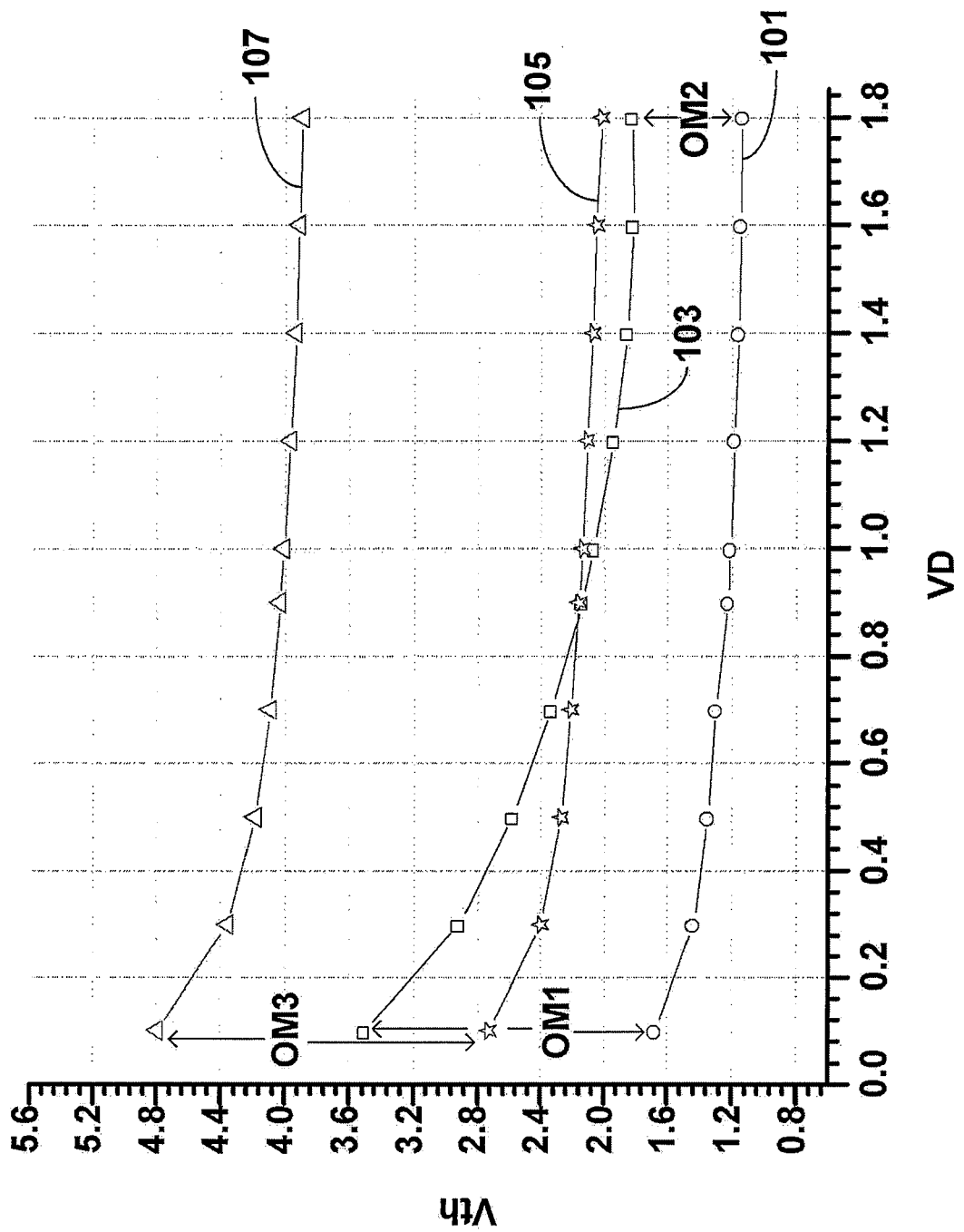
FIG. 1 is a graph showing the relationship between the working voltage Vth and the drain operation voltage VD of a memory cell.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
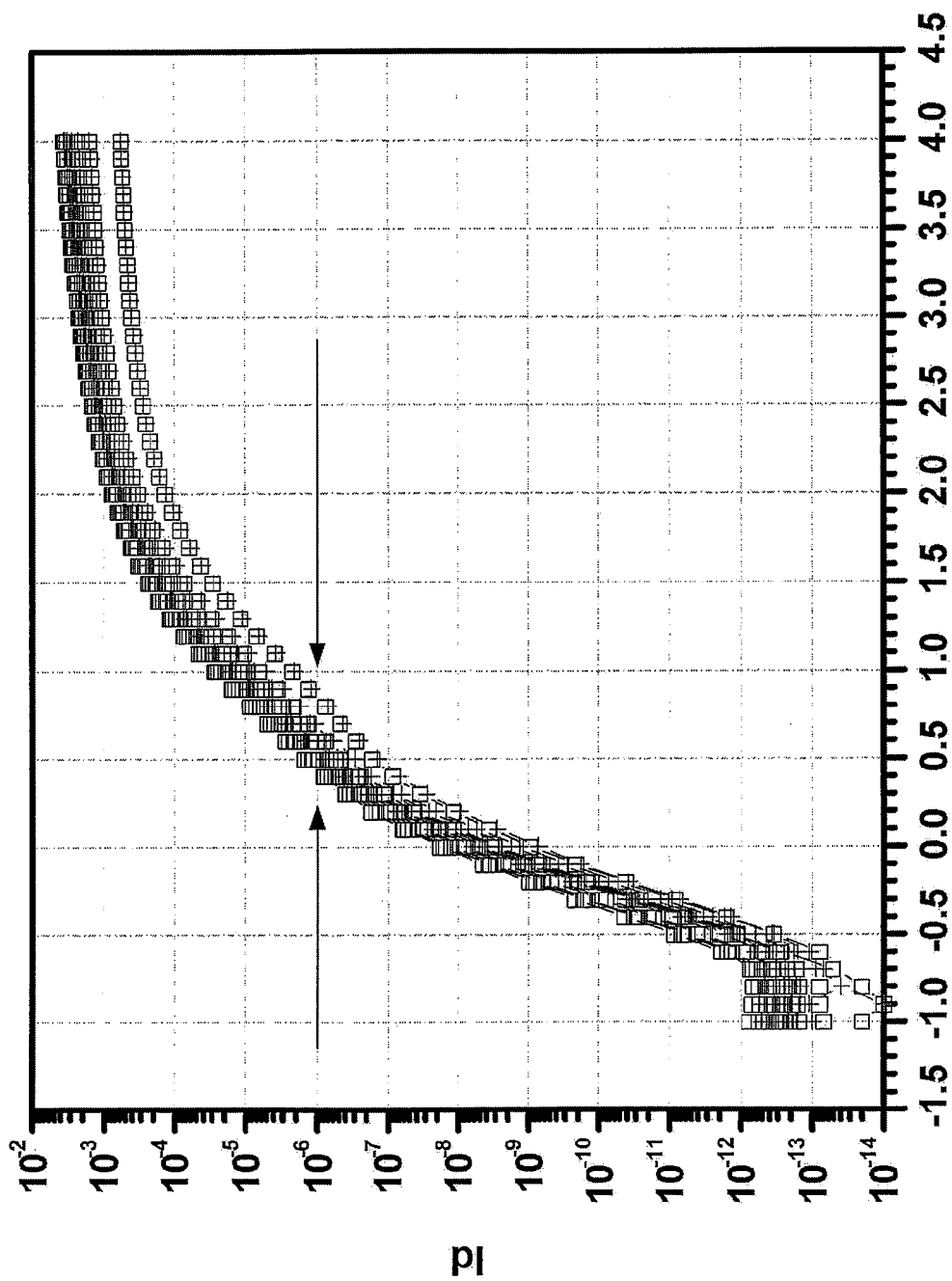
FIG. 2A is a graph showing the relationship between the working current Ids and the gate voltage VG for a memory cell in an erase state.
Figure 2B:
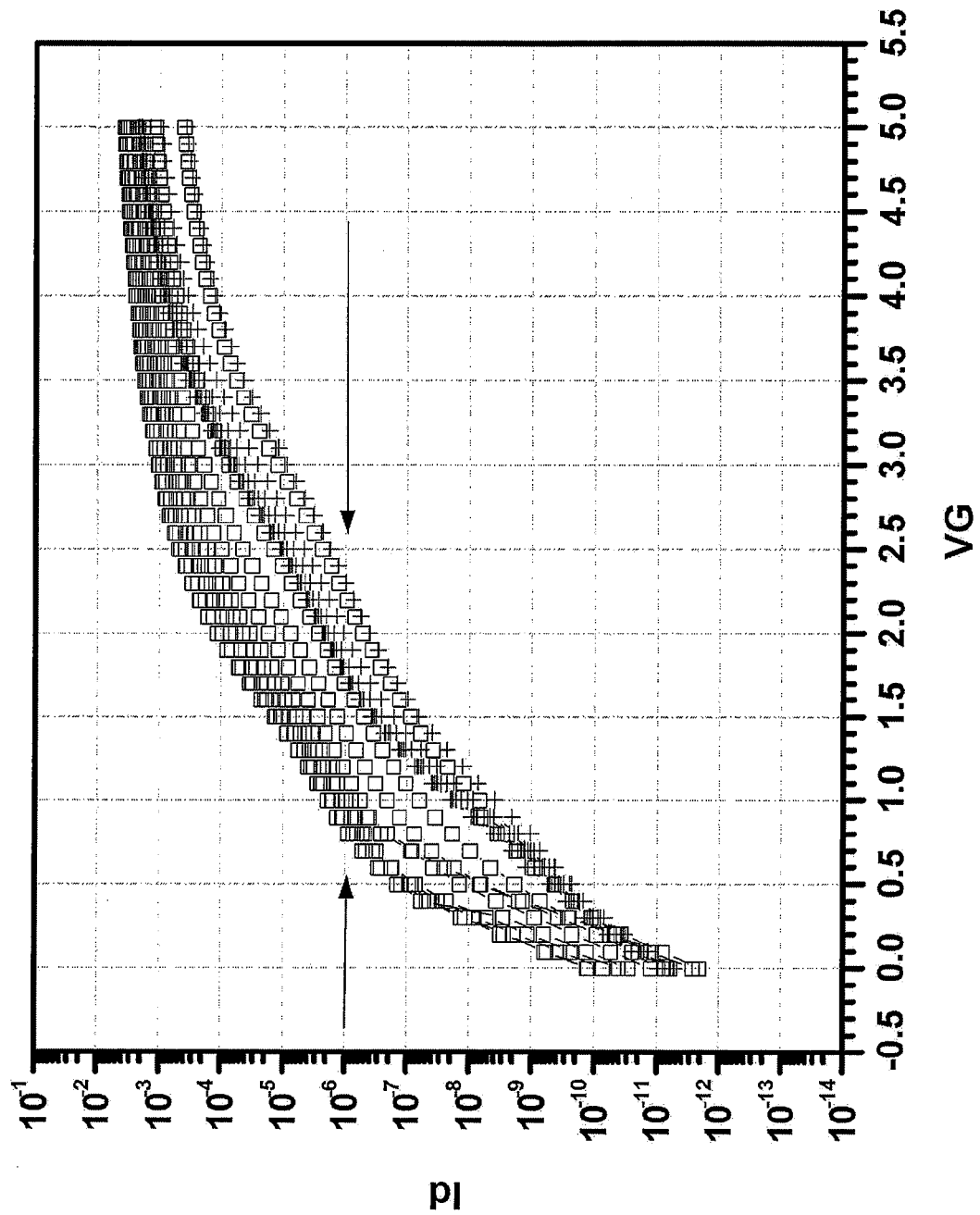
FIG. 2B is a graph showing the relationship between the working current Ids and the gate voltage VG for a memory cell in a program state.

FIG. 2A is a graph showing the relationship between the working current Ids and the gate voltage VG for a memory cell in an erase state. FIG. 2B is a graph showing the relationship between the working current Ids and the gate voltage VG for a memory cell in a program state. As shown in FIGS. 2A and 2B, the different curves in the same graph represent the change in working current Id when the drain operation voltage on the drain of the memory cell changes. As shown in FIG. 2A, the application of different drain operation voltages to the drain of the memory cell causes a smaller variation in the working current Id than the same in FIG. 2B.

In other words, when the drain operation voltage on the drain of the memory cell changes, the variation of the working current Id of the memory cell operating in the erase state is less than that of the memory cell operating in the program state. The present invention utilizes this particular characteristic to define the memory erase state or the program state of the memory cell.

As shown in FIG. 1, the working voltage Vth shifts when the drain operation voltage VD starts to increase and hence leads to a retraction of the operating boundary. However, the working voltage Vth is a function of the drain operation voltage VD so that the slope of the curves 101 and 103 are obviously different (can be confirmed by FIGS. 2A and 2B). Therefore, the present invention utilizes the differential value of the working voltage Vth to drain operation voltage VD to define the program state or the erase state of the memory cell.

Figure 3:
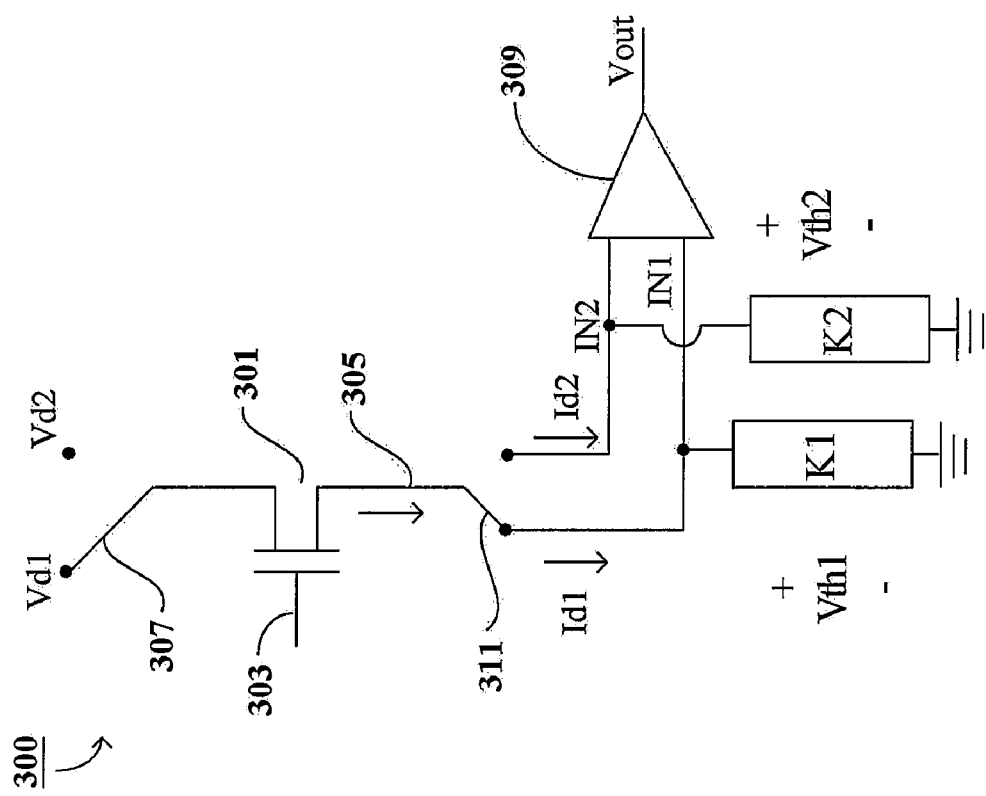
FIG. 3 is a circuit diagram of a memory device according to one embodiment of the present invention.

FIG. 3 is a circuit diagram of a memory device according to one embodiment of the present invention. As shown in FIG. 3, the memory device 300 may include a plurality of memory cells 301. The gate terminal of the memory cell 301 is coupled to a word line 303, the source terminal of the memory cell 301 is coupled to a bit line 305, and the drain terminal of the memory cell 301 is coupled to a drain operation voltage Vd1 or Vd2 through a switching circuit 307. Furthermore, the memory device 300 includes a comparator 309 having compare input terminals IN1 and IN2 which are respectively grounded through passive devices K1 and K2 such as resistors or capacitors and also connected to the bit line 305 through a switching circuit 311.

When the memory cell 301 is enabled, the switching circuit 307 directs the drain operation voltage Vd1 to the drain of the memory cell 301. The memory cell 301 generates a working current Id1 that flows into the compare input terminal IN1 via the bit line 305. As the working current Id1 flows into the compare input terminal IN1, it is transformed by the passive device K1 into a working voltage Vth1 and sent to the comparator 309.

Next, the switching circuit 307 directs the drain operation voltage Vd2 to the drain of the memory cell 301. The memory cell 301 generates a working current Id2 that flows into the compare input terminal IN2 according to the drain operation voltage Vd2. Similarly, the working current Id2 is transformed by the passive device K2 into a working voltage Vth2 and sent to the comparator 309.

After receiving the working voltages Vth1 and Vth2, the comparator 309 outputs the difference between the working voltages Vth1 and Vth2 from an output terminal Vout. Thus, the output Vout from the comparator 309 can be divided by the difference between drain operation voltage Vd1 and Vd2 to obtain a partial differential value, that is, the aforementioned slope. From the slope, the program or erase state of the memory cell 301 can be determined.

In the present embodiment, the memory cell 301 may have at least one storage area. In some other embodiments, the memory cell 301 can be a SONOS structure or a dual MONOS structure.

In the SONOS structure, the foregoing method cannot be used to separately operate the two storage areas because the two storage areas will interfere with each other. However, in the dual MONOS structure, the second word line can be used as a switch for the two storage areas so that the two storage areas will not interfere with each other.

The present invention also provides an operating mechanism capable of operating different storage areas. The memory cell 301 is assumed to have a first storage area and a second storage area. When the memory device 300 determines that the slope is smaller than a first preset value, the memory cell 301 is in an erase state. In the present embodiment, the first preset value can be 1.

On the other hand, when the memory device 300 determines that the slope is located between a second preset value and a third preset value, for example, the slope is located between 1 and 2, the memory cell 301 has only one storage area in the program state. Furthermore, when the memory device 300 determines that the slope is located between a fourth preset value and a fifth preset value, for example, the slope is located between 2 and 3, the memory cell 301 has two storage areas in the program state.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory device, comprising:
   at least one memory cell, disposed between a word line and a bit line;
   a comparator, having a first compare input terminal and a second compare input terminal;

a first passive device, having a first terminal grounded and a second terminal coupled to the first compare input terminal;

a second passive device, having a first terminal grounded and a second terminal coupled to the second compare input terminal;

a first switching circuit, for selectively applying either a first operating voltage or a second operating voltage to the drain of the memory cell so that the memory cell generates a working current; and a second switching circuit, coupled to the bit line for sending the working current through the bit line to either the first compare input terminal or the second compare input terminal.

2. The memory device of claim 1, wherein the memory cell comprises a silicon/oxide/nitride/oxide/silicon (SONOS) structure including a drain coupled to the first switching circuit, a gate coupled to the word line and a source coupled to the second switching circuit.

3. The memory device of claim 1, wherein the memory cell comprises a dual metal/oxide/nitride/oxide/silicon (MONOS) structure comprising a drain coupled to the first switching circuit, a gate coupled to the word line, and a source coupled to the second switching circuit.

4. The memory device of claim 1, wherein the first passive device and the second passive device are comprised of capacitors.

5. The memory device of claim 1, wherein the first passive device and the second passive device are comprised of resistors.

6. A method of operating a memory device for determining a program/erase state of a memory cell in the memory device, comprising:

applying a first drain operation voltage to a drain of the memory cell so that the memory cell generates a first working current;

applying a second drain operation voltage to the drain of the memory cell so that the memory cell generates a second working current;

transforming the first working current into a first working voltage;

transforming the second working current into a second working voltage;

dividing a differential voltage between the second working voltage and the first working voltage by a differential voltage between the second drain operation voltage and the first drain operation voltage to obtain a partial differential value; and determining the program/erase state of the memory cell according to the partial differential value.

7. The method of operating the memory device of claim 6, wherein the memory cell comprises a single storage area.

8. The method of operating the memory device of claim 6, wherein the memory cell comprises at least two storage areas.

9. The method of operating the memory device of claim 6, wherein the memory cell comprises a silicon/oxide/nitride/oxide/silicon (SONOS) structure.

10. The method of operating the memory device of claim 6, wherein the memory cell comprises a dual metal/oxide/nitride/oxide/silicon (MONOS) structure.

* * * * *